US012802536B2

(12) United States Patent
Shen et al.

(10) Patent No.: US 12,802,536 B2
(45) Date of Patent: Nov. 17, 2026

(54) OPTICAL COMPONENT DRIVING MECHANISM

(71) Applicant: Actutek Corporation, Taoyuan City (TW)

(72) Inventors: Wei-Jhe Shen, Taoyuan City (TW); Yi-Ho Chen, Taoyuan City (TW)

(73) Assignee: Actutek Corporation, Taoyuan City (TW)

( * ) Notice: Subject to any disclaimer, the term of this patent is extended or adjusted under 35 U.S.C. 154(b) by 21 days.

(21) Appl. No.: 19/234,791

(22) Filed: Jun. 11, 2025

(65) Prior Publication Data

US 2025/0308353 A1 Oct. 2, 2025

Related U.S. Application Data

(63) Continuation of application No. 17/884,097, filed on Aug. 9, 2022, now Pat. No. 12,354,465.

(60) Provisional application No. 63/230,990, filed on Aug. 9, 2021.

(51) Int. Cl.

| | |
|---|---|
| ***G08B 6/00*** | (2006.01) |
| ***G02B 7/08*** | (2021.01) |
| ***G03B 5/00*** | (2021.01) |
| ***G03B 9/40*** | (2021.01) |
| ***G03B 13/36*** | (2021.01) |
| ***H02K 11/21*** | (2016.01) |
| ***H02K 41/035*** | (2006.01) |
| ***H04N 23/51*** | (2023.01) |
| ***H04N 23/54*** | (2023.01) |
| ***H04N 23/55*** | (2023.01) |
| ***H04N 23/57*** | (2023.01) |
| ***H05K 1/181*** | (2026.01) |

(52) U.S. Cl.
CPC ................ *G08B 6/00* (2013.01); *G02B 7/08* (2013.01); *G03B 5/00* (2013.01); *G03B 9/40* (2013.01); *G03B 13/36* (2013.01); *H02K 11/21* (2016.01); *H02K 41/0354* (2013.01); *H04N 23/51* (2023.01); *H04N 23/54* (2023.01); *H04N 23/55* (2023.01); *H04N 23/57* (2023.01); *H05K 1/181* (2013.01); *H05K 2201/10916* (2013.01)

(58) Field of Classification Search
CPC ...... G08B 6/00; H02K 11/21; H02K 41/0354; H04N 23/51; H04N 23/54; H04N 23/57; H04N 23/55; G02B 7/08; G03B 5/00; G03B 9/40; G03B 13/36; H05K 1/181; H05K 2201/10916
USPC .......................................................... 348/374
See application file for complete search history.

(56) References Cited

U.S. PATENT DOCUMENTS

2021/0199912 A1* 7/2021 Hu ........................ G02B 7/021

* cited by examiner

*Primary Examiner* — Joel W Fosselman
(74) *Attorney, Agent, or Firm* — MUNCY, GEISSLER, OLDS & LOWE, P.C.

(57) ABSTRACT

An optical component driving mechanism is provided. The optical component driving mechanism includes a first movable portion, a fixed portion, a first circuit member, and a first reinforcing component. The first movable portion is connected to the first optical component. The first optical component has a first optical axis. The first movable portion is movable relative to the fixed portion. The first circuit member is disposed on the fixed portion, and the first circuit member is configured to transmit electrical signals. The first reinforcing component is disposed on the first circuit member.

20 Claims, 8 Drawing Sheets

OPTICAL COMPONENT DRIVING MECHANISM

CROSS REFERENCE TO RELATED APPLICATIONS

This application is a Continuation of application Ser. No. 17/884,097, filed 9 Aug. 2022, which claims the benefit of provisional Application No. 63/230,990, filed 9 Aug. 2021, the entirety of which is incorporated by reference herein.

BACKGROUND OF THE INVENTION

Field of the Invention

The present disclosure relates to an optical component driving mechanism, and more particularly to an optical component driving mechanism with a reinforcing component.

Description of the Related Art

Technology has developed to the point that many electronic devices such as tablet computers and smart phones are equipped with lens modules nowadays, so that they have the functionality of taking pictures and videos. If an electronic device equipped with a lens module happens to shake while the user is using the camera function, the image captured by the lens module may come out blurry. However, requirements for image quality are increasing daily, making it ever more important for the lens module to have an excellent optical image stabilization function.

BRIEF SUMMARY OF THE INVENTION

An optical component driving mechanism is provided. The optical component driving mechanism includes a first movable portion, a fixed portion, a first circuit member, and a first reinforcing component. The first movable portion is connected to the first optical component. The first optical component has a first optical axis. The first movable portion is movable relative to the fixed portion. The first circuit member is disposed on the fixed portion, and the first circuit member is configured to transmit electrical signals. The first reinforcing component is disposed on the first circuit member.

According to some embodiments of the present disclosure, the fixed portion includes a base and a bracket member. The bracket member is partially embedded in the base.

According to some embodiments of the present disclosure, the bracket member includes a retaining wall and a top plate. The base includes a top surface. The top surface of the base exposes the top plate. The retaining wall includes a first surface, and the top plate includes a second surface. The first surface is perpendicular to the second surface.

According to some embodiments of the present disclosure, the optical component driving mechanism further includes a first driving assembly for driving the first movable portion to move relative to the fixed portion. The first driving assembly includes a magnetic component. The magnetic component is disposed on the retaining wall.

According to some embodiments of the present disclosure, the fixed portion further includes a top cover. The top cover includes a filling portion. The top cover is affixed to the base by soldering the top plate to the filling portion.

According to some embodiments of the present disclosure, the optical component driving mechanism further includes a second circuit member. The first circuit member includes a first electrical connection portion, the second circuit member includes a second electrical connection portion. The first electrical connection portion is electrically connected to the second electrical connection portion.

According to some embodiments of the present disclosure, the first electrical connection portion is connected to the second electrical connection portion by soldering.

According to some embodiments of the present disclosure, the optical component driving mechanism further includes a first sensing component. The first sensing component disposed on the second circuit member to sense the position of the first movable portion relative to the fixed portion.

According to some embodiments of the present disclosure, the optical component driving mechanism further includes a second reinforcing component. The second electrical connection portion of the second circuit member is disposed between the second reinforcing component and the first electrical connection portion of the first circuit member.

According to some embodiments of the present disclosure, the fixed portion includes an accommodating portion. The second reinforcing component is disposed in the accommodating portion.

According to some embodiments of the present disclosure, the first circuit member includes an inner surface and an outer surface. The first reinforcing component is disposed on the outer surface, and the second reinforcing component is disposed on the inner surface.

According to some embodiments of the present disclosure, the first reinforcing component and the second reinforcing component do not overlap in a direction that is perpendicular to the first optical axis.

According to some embodiments of the present disclosure, the optical component driving mechanism further includes a control integrated circuit, a first sensing component, and a first driving assembly. The control integrated circuit controls the output of a first driving signal to drive the first driving assembly.

According to some embodiments of the present disclosure, the fixed portion includes an opening. The control integrated circuit is disposed on the first circuit member, and the opening accommodates the control integrated circuit.

According to some embodiments of the present disclosure, the first sensing component receives the first driving signal, and then outputs first driving power to the first driving assembly.

According to some embodiments of the present disclosure, the optical component driving mechanism further includes a second reinforcing component. The first reinforcing component, the second reinforcing component, and the control integrated circuit are located on the same side of the optical component driving mechanism.

According to some embodiments of the present disclosure, the optical component driving mechanism further includes a second driving assembly. The control integrated circuit outputs a second driving signal to drive the second driving assembly.

According to some embodiments of the present disclosure, the optical component driving mechanism further includes a second sensing component that outputs a second sensing signal to the control integrated circuit. The control integrated circuit outputs the second driving signal according to the second sensing signal.

According to some embodiments of the present disclosure, the first reinforcing component includes a magnetically permeable material.

According to some embodiments of the present disclosure, the optical component driving mechanism further includes a second circuit member. The second circuit member includes a first portion and a second portion. The first portion is located on one side of the first movable portion, and the second portion is located on the other side of the first movable portion.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

In order to make the purpose, features, and advantages of the present disclosure more obvious and understandable, the following embodiments are specially cited, and the accompanying drawings are used for detailed description. Among them, the configuration of each component in the embodiment is for illustration purposes, and is not intended to limit the disclosure. In addition, part of the repetition of the reference numbers in the embodiments is for simplifying the description, and does not mean the relevance between different embodiments. The directional terms mentioned in the following embodiments, for example: up, down, left, right, front or back, etc., are only directions for referring to the attached drawings. Therefore, the directional terms used are used to illustrate and not to limit the disclosure.

In addition, relative terms such as “lower” or “bottom” and “higher” or “top” may be used in the embodiments to describe the relative relationship between one component of the illustration and another component. It can be understood that if the illustrated device is turned upside down, the components described on the “lower” side will become the components on the “higher” side.

The optical component driving mechanism of the embodiment of the present invention is described below. However, it can be easily understood that the embodiments of the present invention provide many suitable inventive concepts and can be implemented in a wide variety of specific backgrounds. The specific embodiments disclosed are only used to illustrate the use of the present invention in a specific method, and are not used to limit the scope of the present invention. Unless otherwise defined, all terms used here (including technical and scientific terms) have the same meanings commonly understood by the general artisans to whom the disclosures in this article belong. It is understandable that these terms, such as the terms defined in commonly used dictionaries should be interpreted as having a meaning consistent with the relevant technology and the background or context of this disclosure, and should not be interpreted in an idealized or excessively formal way, unless specifically defined herein.

Figure 1:
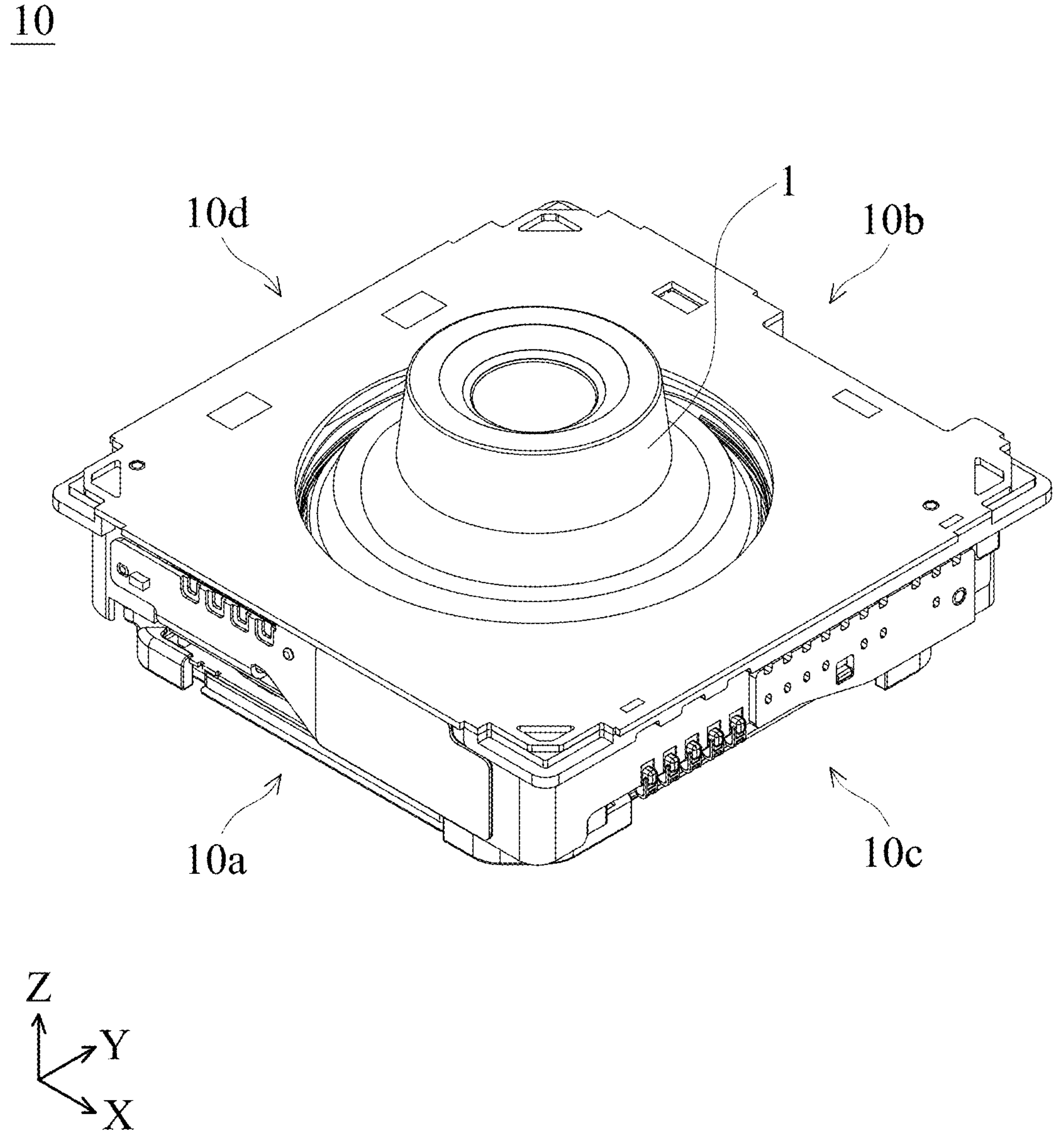
FIG. 1 shows a perspective view of an optical component driving mechanism, according to some embodiments of the present disclosure.

FIG. 1 shows a perspective view of an optical component driving mechanism 10, according to some embodiments of the present disclosure. The aforementioned optical component driving mechanism 10 may be disposed inside an electronic device such as a camera, a tablet computer, or a mobile phone, to obtain images. The aforementioned optical component driving mechanism 10 may relatively move both the first optical component 1 and the second optical component 2 (FIG. 2) disposed therein, so as to achieve the purpose of auto-focusing (AF) and optical image stabilization (OIS). The detailed structure of the optical component driving mechanism 10 is described below.

As shown in FIG. 1, the optical component driving mechanism 10 has a substantially rectangular shape, and the optical component driving mechanism 10 includes a first side 10*a*, a second side 10*b*, a third side 10*c*, and a fourth side 10*d*.

According to some embodiments of the present disclosure, the first side 10*a* is opposite to the second side 10*b*, and the first side 10*a* and the second side 10*b* are parallel to each other. According to some embodiments of the present disclosure, the third side 10*c* is opposite to the fourth side 10*d*, and the third side 10*c* and the fourth side 10*d* are parallel to each other.

Figure 2:
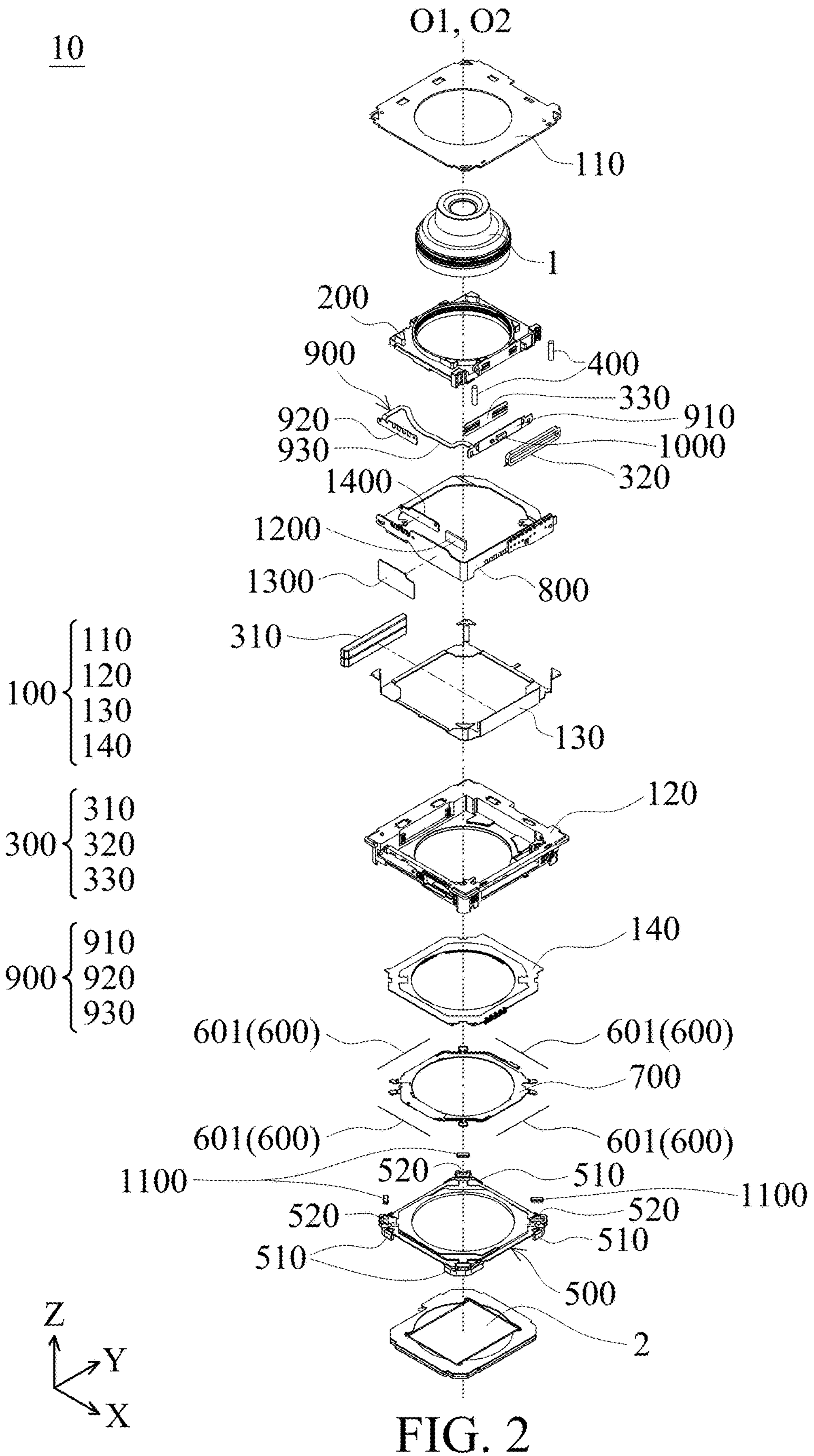
FIG. 2 is an exploded view of the optical component driving mechanism, according to some embodiments of the present disclosure.
Figure 6A:
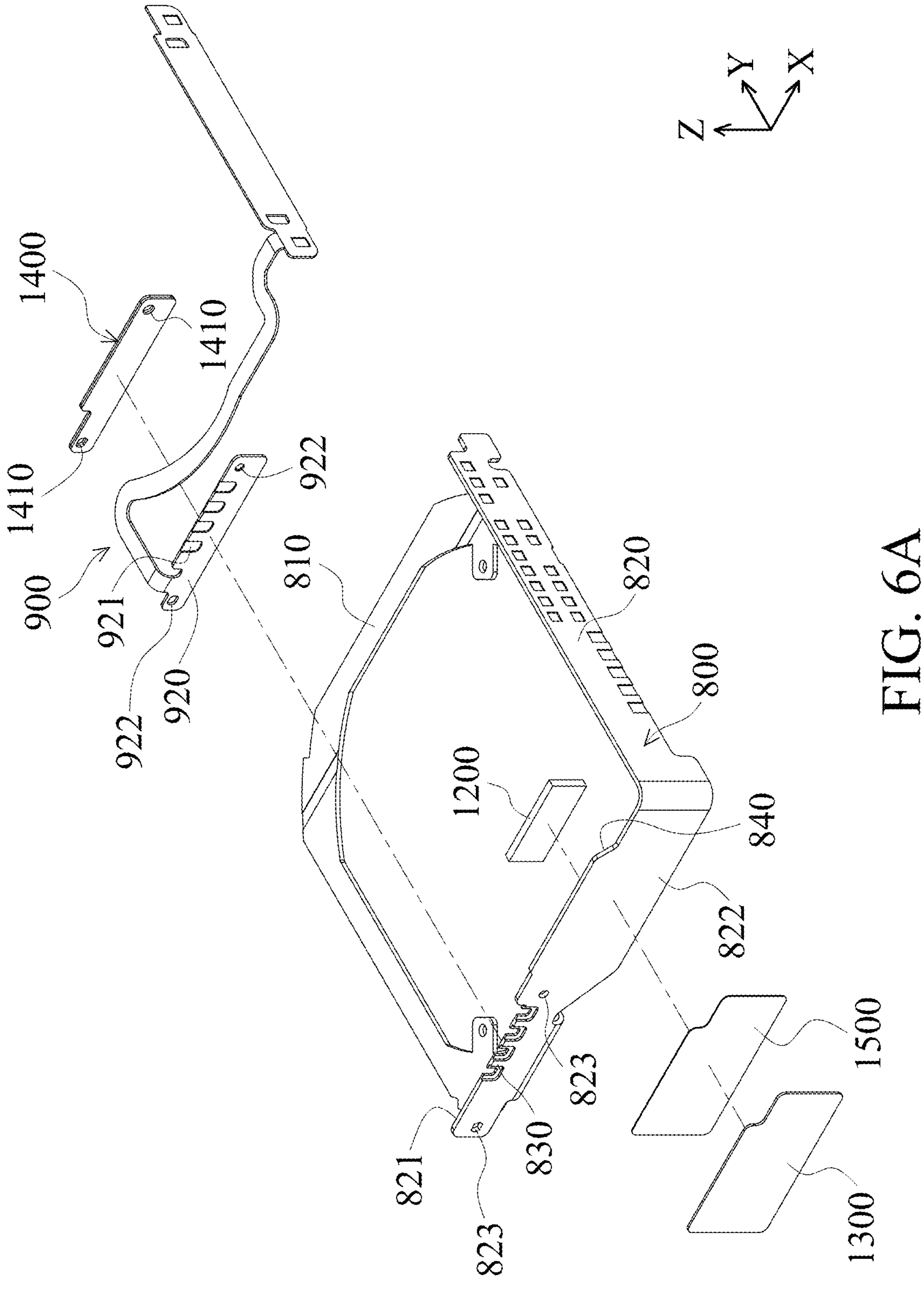
FIG. 6A shows an exploded view of a first circuit component, the second circuit component, a control integrated circuit, a first reinforcing component, a second reinforcing component, and an adhesive component, according to some embodiments of the present disclosure.

FIG. 2 is an exploded view of the optical component driving mechanism 10, according to some embodiments of the present disclosure. As shown in FIG. 2, the optical component driving mechanism 10 includes a fixed portion 100, a first movable portion 200, a first driving assembly 300, a set of supporting components 400, a second movable portion 500, a second driving assembly 600, a connecting plate 700, a first circuit member 800, a second circuit member 900, a first sensing component 1000, a set of second sensing components 1100, a control integrated circuit 1200, a first reinforcing component 1300, a second reinforcing component 1400, and an adhesive component 1500 (FIG. 6A).

Please refer to FIG. 1 to FIG. 2 together. According to some embodiments of the present disclosure, the fixed portion 100 includes a top cover 110, a base 120, a bracket member 130, and a base plate 140. The top cover 110 is connected to the base 120 to form an interior space and accommodate other components of the optical component driving mechanism 10. The bracket member 130 is embedded in the base 120. This configuration may strengthen the mechanical strength of the fixed portion 100. The bracket member 130 may be made of magnetically permeable material. The configuration of the substrate 140 is described in detail later.

According to some embodiments of the present disclosure, the first movable portion 200 is connected to the first optical component 1. Specifically, the first movable portion 200 fixedly holds the first optical component 1. Therefore, the first optical component 1 will move with the first movable portion 200 when the first movable portion 200 moves. The first optical component 1 has a first optical axis O1, and the first optical axis O1 is substantially parallel to the Z-axis.

The first driving assembly 300 may drive the first movable portion 200 to move relative to the fixed portion 100 in the first optical axis O1, so as to perform the auto-focusing function of the optical component driving mechanism 10. According to some embodiments of the present disclosure, the first driving assembly 300 includes a magnetic component 310, a coil 320, and a magnetically permeable component 330.

According to some embodiments of the present disclosure, the magnetic component 310 is disposed on the base 120 and the bracket member 130. The magnetic component 310 corresponds to the coil 320. The coil 320 is disposed on the first movable portion 200. The magnetically permeable component 330 is disposed between the first movable portion 200 and the coil 320. The magnetically permeable component 330 may concentrate the magnetic force of the magnetic component 310 in a predetermined direction, so as to enhance the magnetic thrust of the first driving assembly 300 to drive the first movable portion 200 to move, and reduce the effect of magnetic interference.

When a driving signal is applied to the first driving assembly 300 (for example, a current is applied by an external power source), a magnetic force is generated between the magnetic component 310 and the coil 320, which may drive the first movable portion 200 to move relative to the fixed portion 100 to achieve the function of auto-focusing.

According to some embodiments of the present disclosure, the supporting components 400 are two guide rods extending parallel to the first optical axis O1 (Z-axis). The first movable portion 200 is movable relative to the fixed portion 100 by sliding along the supporting components 400. Compared with the configuration in the prior art that uses a spring sheet to movably connect the lens holder, the supporting component 400 used in the present invention allows the first movable portion 200 to hold the optical component 1 with larger mass and size. Thereby, the performance of the optical component driving mechanism 10 is improved.

According to some embodiments of the present disclosure, the second movable portion 500 fixedly holds the second optical component 2. Therefore, the second optical component 2 will move with the second movable portion 500 when the second movable portion 500 moves. The second optical component 2 has a second optical axis O2. For the purpose of illustration, the second optical axis O2 in FIG. 2 is substantially parallel to the Z-axis.

When viewed along the Z-axis, the second movable portion 500 has a substantially square shape with four corners. The second movable portion 500 includes four stopper portions 510 and three grooves 520. When the second movable portion 500 is driven, the stopper portion 510 may limit the movement range of the second movable portion 500 relative to the fixed portion 100.

The four stopper portions 510 are respectively located at four corners of the second movable portion 500. The three grooves 520 are respectively located at the corner intersecting the first side 10*a* and the fourth side 10*d*, at the corner intersecting the second side 10*b* and the third side 10*c*, and at and the corner intersecting the second side 10*b* and the fourth side 10*d*.

According to some embodiments of the present disclosure, the second driving assembly 600 may drive the second movable portion 500 to move relative to the fixed portion 100. Specifically, the second driving assembly 600 includes a plurality of biasing components 601. The biasing component 601 may have a shape memory alloy (Shape Memory Alloys, SMA) material, such as titanium-nickel alloy (TiNi), titanium-palladium alloy (TiPd), titanium-nickel-copper alloy (TiNiCu), titanium-nickel-palladium alloy (TiNiPd), etc.

Moreover, the length of the biasing components 601 may be changed by applying a driving signal, such as, current, to the biasing components 601 through a power supply. In addition, different driving signals may be applied to the biasing components 601 to separately control the length variation of each biasing component 601.

According to some embodiments of the present disclosure, the connecting plate 700 may be a spring plate. The connecting plate 700 is disposed between the base plate 140 and the second movable portion 500. When a driving signal is applied to the biasing components 601, each biasing component 601 may have the same or different length changes. Then, the second movable portion 500 may be driven to move relative to the base plate 140 of the fixed portion 100 via the connecting plate 700, and therefore the second optical component 2 may be driven to move, including translation, rotation, etc., to achieve auto-focusing, optical image stabilization, tilt correction and so on.

According to some embodiments of the present disclosure, the first circuit member 800 may be a flexible printed circuit (FPC). The first circuit member 800 is fixedly disposed on the base 120. The first circuit member 800 is configured to transmit electrical signals. The first circuit member 800 is electrically connected to the first driving assembly 300 and the second driving assembly 600.

According to some embodiments of the present disclosure, the second circuit member 900 may be a flexible printed circuit board. The second circuit member 900 is electrically connected to the first driving assembly 300 and the first circuit member 800. The second circuit member 900 includes a first portion 910, a second portion 920, and a third portion 930.

The first portion 910 is disposed on the first movable portion 200 and located between the coil 320 and the magnetically permeable component 330. The second portion 920 is disposed on the base 120, the details of which are described in detail with respect to FIG. 7.

Two ends of the third portion 930 are respectively connected to the first portion 910 positioned on the first movable portion 200 and the second portion 920 positioned on the base 120. Therefore, when the first movable portion 200 moves in the first optical axis O1 through the first driving assembly 300, the flexible third portion 930 is movably connected to the first movable portion 200 and the base 120 via the first portion 910 and the second portion 920.

According to some embodiments of the present disclosure, the first sensing component 1000 is configured to sense the position of the first movable portion 200 relative to the fixed portion 100. The first sensing component 1000 is disposed on the first portion 910 of the second circuit member 900.

It should be understood that the magnetic component 310 disposed on the second side **10*b* is served as the magnetic component 310 of the first driving assembly 300 and the reference component for the first sensing component 1000 at the same time. In this way, the magnetic component 310 can perform both driving and sensing functions, and the volume of the optical component driving mechanism 10** may be reduced to achieve miniaturization.

According to some embodiments of the present disclosure, the second sensing components 1100 are sensing magnetic components, and the second sensing components 1100 correspond to the control integrated circuit 1200. The second sensing components 1100 are disposed in the grooves 520 of the second movable portion 500.

According to some embodiments of the present disclosure, the control integrated circuit 1200 is disposed on the first circuit member 800. The control integrated circuit 1200 is an all-in-one integrated circuit in which the sensing integrated circuit and the control integrated circuit are packaged in the same package. That is, the control integrated circuit 1200 has both a driving function and a sensing function.

According to some embodiments of the present disclosure, the control integrated circuit 1200 controls the output of a first driving signal to drive the first driving assembly 300. The first sensing component 1000 receives the first driving signal, and then outputs the first driving power to the first driving assembly 300.

According to some embodiments of the present disclosure, the control integrated circuit 1200 may determine the position of the second sensing components 1100 by detecting the change of the magnetic field of the second sensing components 1100, thereby increasing the accuracy of compensation or focusing.

That is, the control integrated circuit 1200 outputs a second driving signal to drive the second driving assembly 600. More specifically, the second sensing components 1100 output a second sensing signal (magnetic field change) to the control integrated circuit 1200, and the control integrated circuit 1200 outputs the second driving signal according to the second sensing signal.

According to some embodiments of the present disclosure, the first reinforcing component 1300 is disposed on the opposite side of the first circuit member 800 relative to the control integrated circuit 1200. The first reinforcing component 1300 is configured to strengthen the mechanical strength of the first circuit member 800, and the first reinforcing component 1300 reduces the external magnetic field interference on the control integrated circuit 1200. The first reinforcing component 1300 may be made of metal material or magnetically permeable material.

Figure 7:
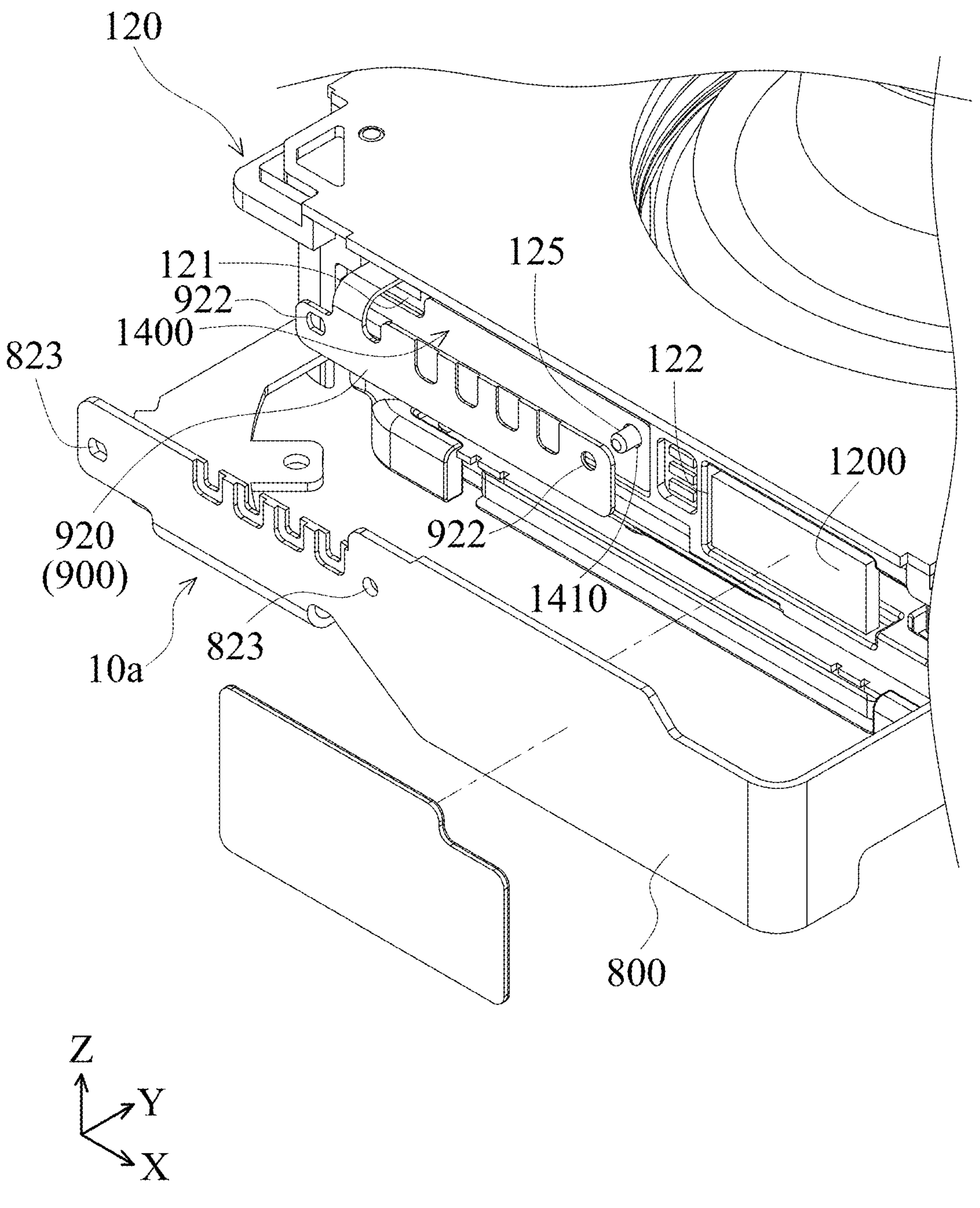
FIG. 7 shows an exploded view of the first side of the optical component driving mechanism according to some embodiments of the present disclosure.

According to some embodiments of the present disclosure, the second reinforcing component 1400 is disposed on the base 120, the details of which are more clearly shown with respect to FIG. 7. The second reinforcing component 1400 is configured to strengthen the mechanical strength of the second portion 920 of the second circuit member 900. Therefore, the second circuit member 900 that is simultaneously connected to the base 120 and the first movable portion 200 would not easily deform when the first movable portion 200 is driven. The second reinforcing component 1400 may be made of metal material or magnetically permeable material.

Figure 3:
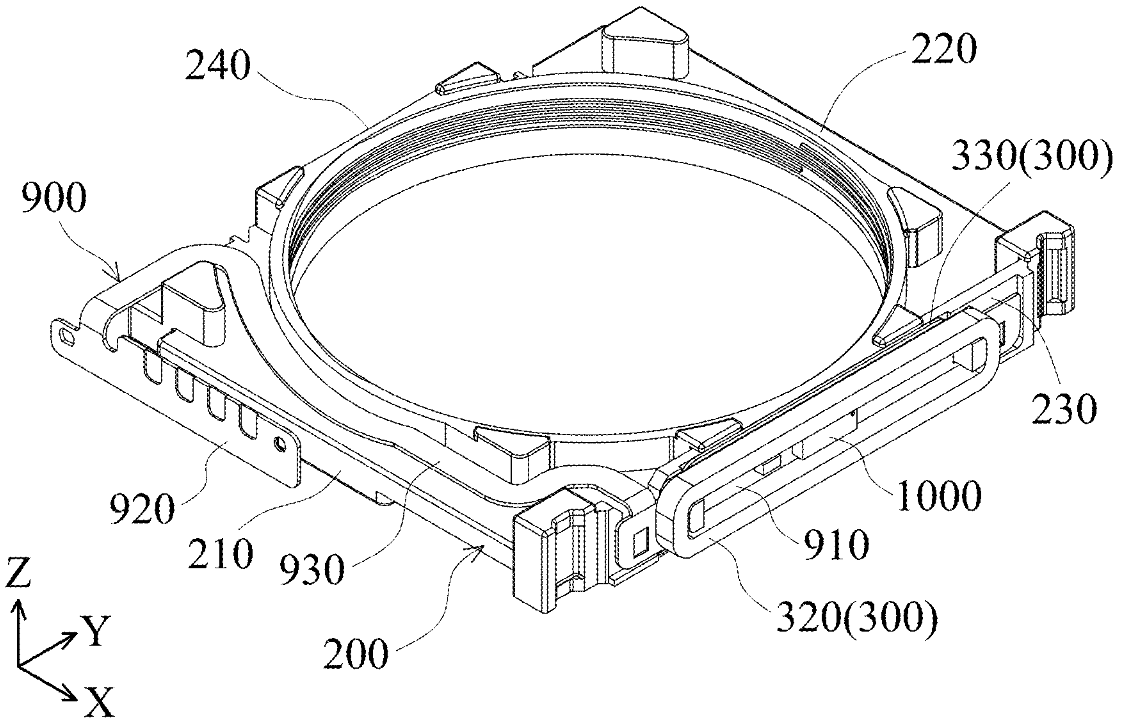
FIG. 3 shows a first movable portion, a coil, a magnetically permeable component, a second circuit member, and a first sensing component, according to some embodiments of the present disclosure.

FIG. 3 shows the first movable portion 200, the coil 320, the magnetically permeable component 330, the second circuit member 900, and the first sensing component 1000, according to some embodiments of the present disclosure. As shown in FIG. 3, the first portion 910 of the second circuit member 900 is disposed between the coil 320 and the magnetically permeable component 330, and the first sensing component 1000 is disposed on the first portion 910 of the second circuit member 900.

As shown in FIG. 3, the first movable portion 200 includes four sides 210, 220, 230 and 240. The side 210 is opposite to the side 220, and the side 210 is parallel to the side 220. The side 230 is opposite to the side 240, and the side 230 is parallel to the side 240. The first portion 910 of the second circuit member 900 is located on the side 230 of the first movable portion 200. The second portion 920 is located on the other adjacent side 210 of the first movable portion 200. The third portion 930 is wound around the first movable portion 200.

It should be understood that when the first movable portion 200 moves in the first optical axis O1 (Z-axis) through the first driving assembly 300, the flexible third portion 930 is movably connected to the first movable portion 200 and the base 120 (FIG. 2) through the first portion 910 and the second portion 920.

Figure 4A:
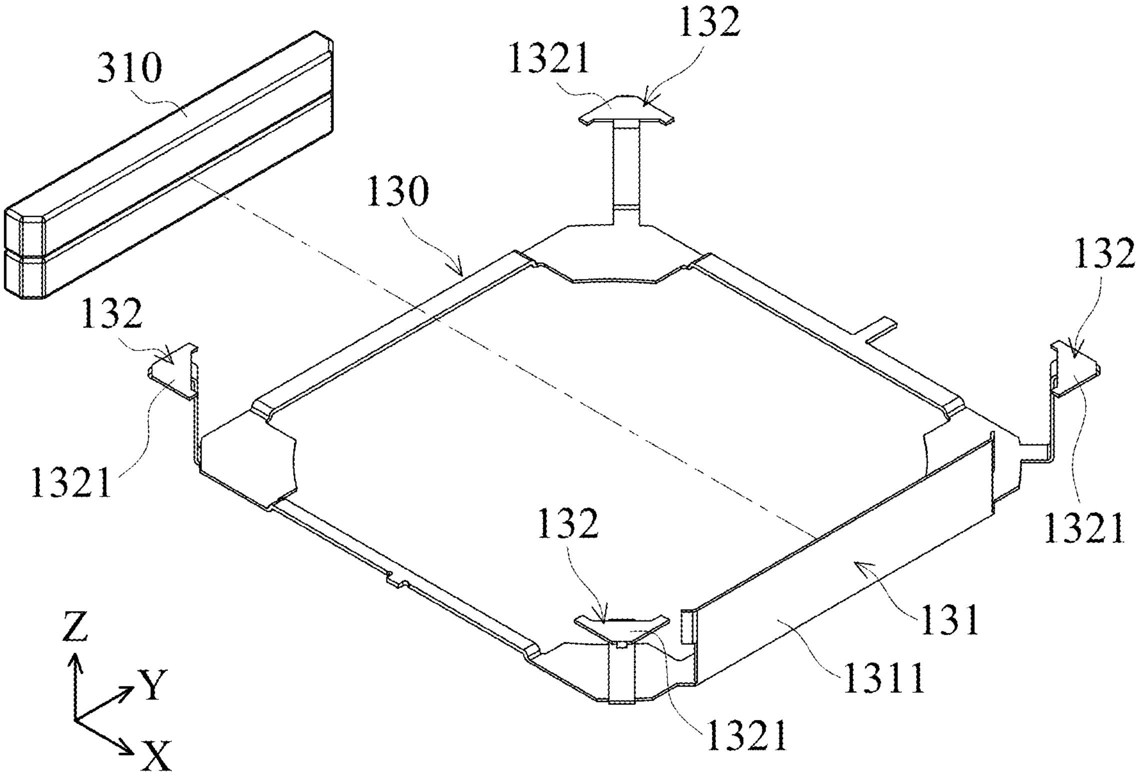
FIG. 4A shows a perspective view of a bracket member and a magnetic component, according to some embodiments of the present disclosure.

FIG. 4A shows a perspective view of the bracket member 130 and the magnetic component 310, according to some embodiments of the present disclosure. As shown in FIG. 4A, the bracket member 130 includes a retaining wall 131 and four top plates 132. The retaining wall 131 includes a first surface 1311. Each top plate 132 includes a second surface 1321. The first surface 1311 is perpendicular to the second surface 1321. As shown in FIG. 4A, the magnetic component 310 is disposed on the retaining wall 131.

Figure 4B:
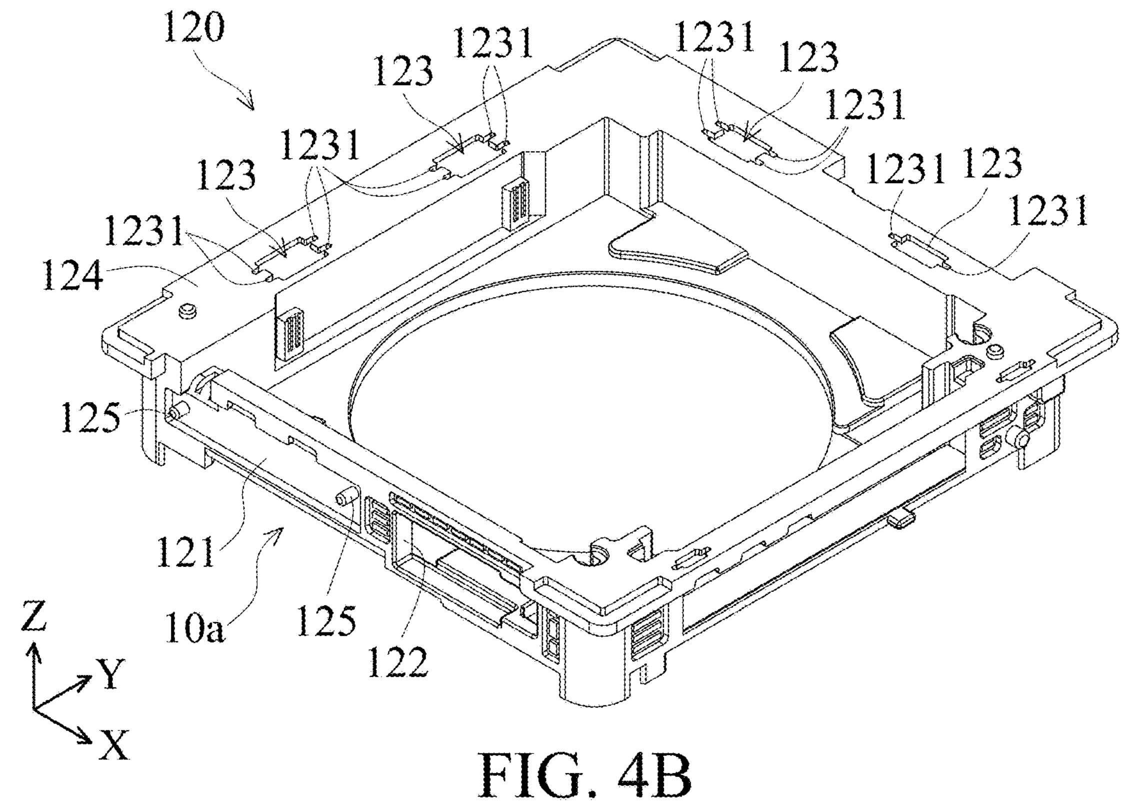
FIG. 4B shows a perspective view of a base, according to some embodiments of the present disclosure.

FIG. 4B shows a perspective view of the base 120, according to some embodiments of the present disclosure. The base 120 includes an accommodating portion 121, an opening 122, a set of glue-filling grooves 123, a top surface 124, and a set of protruding portions 125.

The accommodating portion 121 and the opening 122 are located at the first side **10*a* of the optical component driving mechanism 10. The accommodating portion 121 is configured to accommodate the second reinforcing component 1400 (FIG. 2), the details of which are shown in FIG. 7. The opening 122 is configured to accommodate the control integrated circuit 1200 (FIG. 2) disposed on the first circuit member 800 (FIG. 2), the details of which are shown in FIG. 7**.

A set of glue-filling grooves 123 are located on the top surface 124 of the base 120. Adhesive components (not shown) may be disposed in the glue-filling grooves 123 to affix the base 120 with the top cover 110 (FIG. 2). Each glue-filling groove 123 includes a set of extending portions 1231. This configuration may increase the bonding area between the top cover 110 and the base 120, thereby enhancing the adhesion effect. The protruding portions 125 are located in the accommodating portion 121 for affixing the components disposed in the accommodating portion 121, the details of which are described in detail with respect to FIG. 7.

Figure 4C:
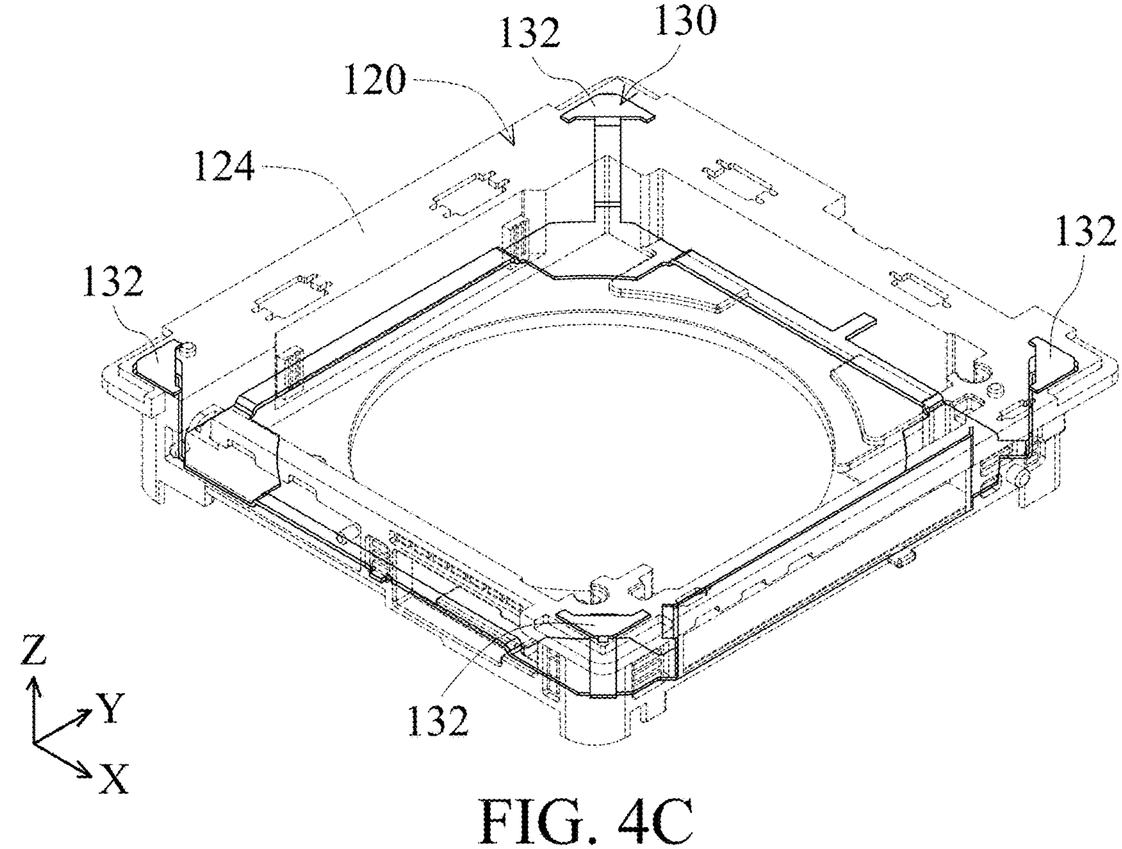
FIG. 4C shows the base and the bracket member, according to some embodiments of the present disclosure, wherein the base is shown in dash line for illustration purposes.

FIG. 4C shows the base 120 and the bracket member 130, according to some embodiments of the present disclosure. The base 120 is shown in dash line for illustration purposes.

The bracket member 130 partially embedded in the base 120 can be seen in FIG. 4C. It can also be seen in FIG. 4C that the top surface 124 of the base 120 exposes the top plate 132 of the bracket member 130.

Figure 5:
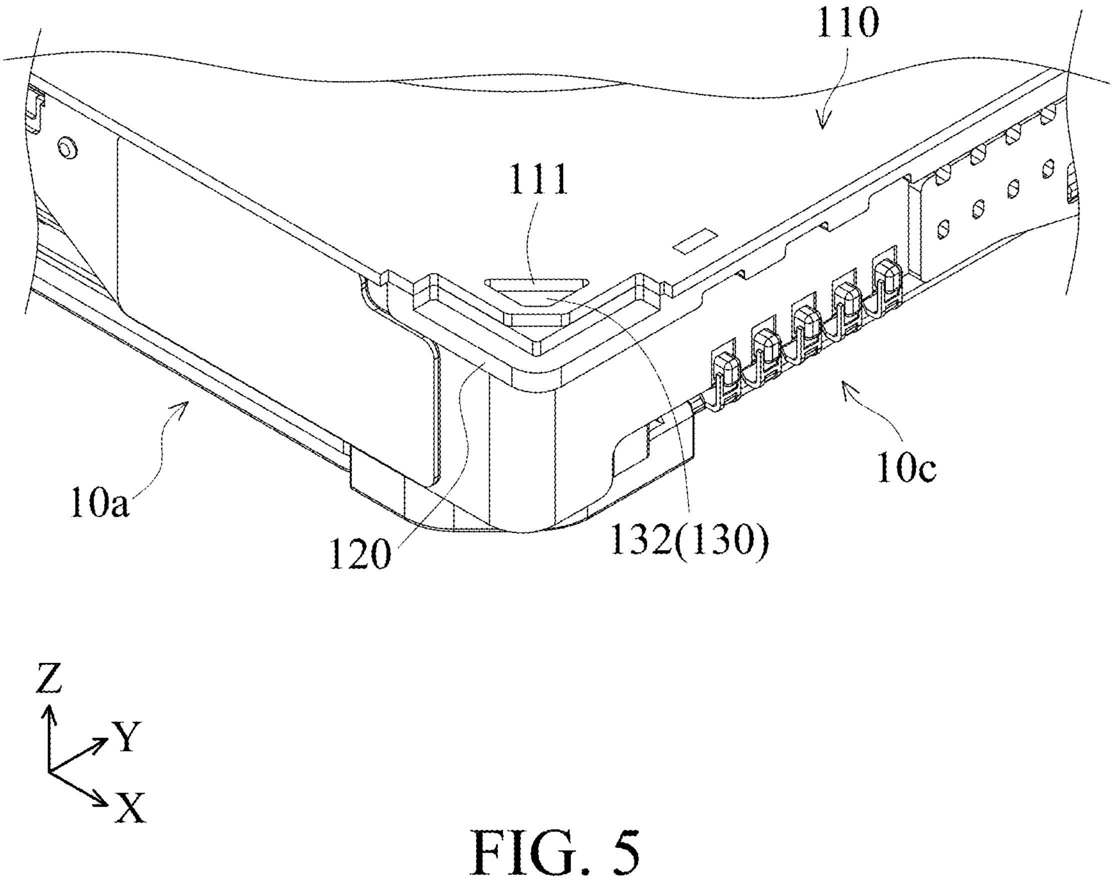
FIG. 5 shows an enlarged view of the junction of a first side and a third side of the optical component driving mechanism, according to some embodiments of the present disclosure.

FIG. 5 shows an enlarged view of the junction of a first side 10*a* and a third side 10*c* of the optical component driving mechanism 10, according to some embodiments of the present disclosure. The top cover 110 includes four filling portions 111 located at the four corners, and only the filling portions 111 located at the junction of the first side 10*a* and the third side 10*c* are shown in FIG. 5 for illustration purposes. The top cover 110 may be affixed to the base 120 by soldering the filling portion 111 and the top plate 132 of the bracket member 130 together.

Figure 6B:
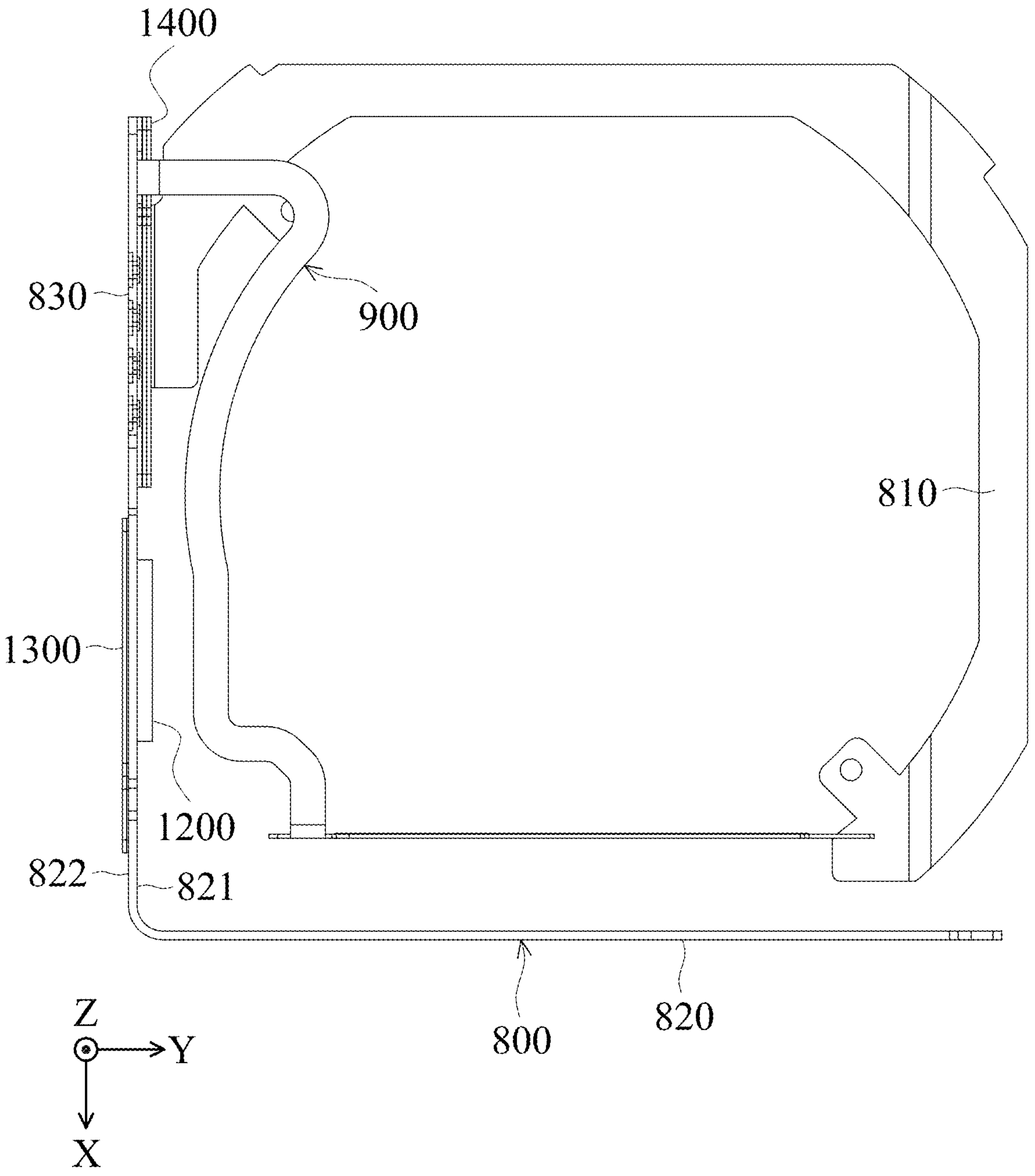
FIG. 6B shows a top view of the first circuit component, the second circuit component, the control integrated circuit, the first reinforcing component, and the second reinforcing component, according to some embodiments of the present disclosure.

FIG. 6A shows an exploded view of the first circuit component 800, the second circuit component 900, the control integrated circuit 1200, the first reinforcing component 1300, the second reinforcing component 1400, and the adhesive component 1500, according to some embodiments of the present disclosure. FIG. 6B shows a top view of the first circuit member 800, the second circuit member 900, the control integrated circuit 1200, the first reinforcing component 1300, and the second reinforcing component 1400, according to some embodiments of the present disclosure.

Please refer to FIGS. 6A to 6B together, the first circuit member 800 includes a fixing plate 810, a vertical portion 820, and a first electrical connection portion 830. The second portion 920 of the second circuit member 900 includes a second electrical connection portion 921 and a set of holes 922. The second reinforcing component 1400 includes a set of holes 1410.

The fixing plate 810 is disposed on the base plate 140 (FIG. 2). The extending direction of the fixing plate 810 is perpendicular to the Z-axis, that is, the fixing plate 810 is substantially parallel to the XY-plane. The extending direction of the vertical portion 820 is parallel to the Z-axis. The extending direction of the fixing plate 810 is perpendicular to the extending direction of the vertical portion 820.

According to some embodiments of the present disclosure, the vertical portion 820 includes an inner surface 821, an outer surface 822, and a set of holes 823. The second portion 920 of the second circuit member 900 is disposed between the inner surface 821 of the vertical portion 820 and the second reinforcing component 1400. The control integrated circuit 1200 is disposed on the inner surface 821 of the vertical portion 820. The first reinforcing component 1300 is disposed on the outer surface 822 of the vertical portion 820. The second reinforcing component 1400 is disposed on the inner surface 821 of the vertical portion 820. The holes 823 are generally aligned with the holes 922 and the holes 1410. The protruding portions 125 of the base 120 (FIG. 4B) pass through the holes 823, 922, and 1410, the details of which are shown with respect to FIG. 7.

According to some embodiments of the present disclosure, the first electrical connection portion 830 is electrically connected to the second electrical connection portion 921. More specifically, the first electrical connection portion 830 is connected to the second electrical connection portion 921 by soldering. The second electrical connection portion 921 is disposed between the second reinforcing component 1400 and the first electrical connection portion 830. In this way, the second reinforcing component 1400 may protect the soldering points of the first electrical connection portion 830 and the second electrical connection portion 921.

According to some embodiments of the present disclosure, the first circuit member 800 further includes a third electrical connection portion 840. The control integrated circuit 1200 is electrically connected to the first circuit member 800 through the third electrical connection portion 840. The first reinforcing member 1300 is affixed to the outer surface 822 of the vertical portion 820 by the adhesive member 1500.

As shown in FIG. 6B, the first reinforcing component 1300 and the second reinforcing component 1400 do not overlap in the direction of the Y-axis that is perpendicular to the first optical axis (Z-axis). In addition, the control integrated circuit 1200, the first reinforcing component 1300, and the second reinforcing component 1400 are located on the same side of the optical component driving mechanism 10.

FIG. 7 shows an exploded view of the first side 10*a* of the optical component driving mechanism 10, according to some embodiments of the present disclosure. As shown in FIG. 7, the control integrated circuit 1200 disposed on the first circuit member 800 is accommodated in the opening 122 of the base 120. The second reinforcing component 1400 is disposed in the accommodating portion 121 of the base 120. The holes 823, 922, 1410 accommodate the protruding portions 125 of the base 120. The protruding portions 125 pass through the holes 1410, 922 and 823 in sequence to fix the positions of the first circuit member 800, the second portion 920 of the second circuit member 900, and the second reinforcing component 1400 relative to the base 120.

To sum up, the optical component driving mechanism of the present invention is provided with two reinforcing components. The configuration of the reinforcing component may not only strengthen the mechanical strength of the second circuit member, so that the second circuit member is not easily deformed when the first movable portion is driven, but also prevents the control integrated circuit from being interfered by signals (such as, electromagnetic waves). The optical component driving mechanism of the present invention has a bracket member partially embedded in the base. This configuration may enhance the overall mechanical strength of the fixed portion. The bracket member is made of metal or magnetically permeable material. The bracket member has a top plate that may be fixedly connected to the base by soldering the top plate and the top cover together.

The ordinal numbers in this specification and the claim, such as "first", "second", etc., do not have a sequential relationship between each other, and they are only used to distinguish two different components with the same name.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:

1. An optical component driving mechanism, comprising:

a first movable portion connected to a first optical component, wherein the first optical component has a first optical axis;

a fixed portion, wherein the first movable portion is movable relative to the fixed portion;

a first circuit member disposed on the fixed portion for transmitting electrical signals;

a first reinforcing component disposed on the first circuit member;

a control integrated circuit;

a first driving assembly, wherein the control integrated circuit controls output of a first driving signal to drive the first driving assembly; and a second reinforcing component, wherein the first reinforcing component, the second reinforcing component, and the control integrated circuit are located on the same side of the optical component driving mechanism.

2. The optical component driving mechanism as claimed in claim 1, wherein the fixed portion comprises a base and a bracket member, wherein the bracket member is partially embedded in the base.

3. The optical component driving mechanism as claimed in claim 2, wherein the bracket member comprises a retaining wall and a top plate, the base comprises a top surface, the top surface of the base exposes the top plate, the retaining wall comprises a first surface, the top plate comprises a second surface, and the first surface is perpendicular to the second surface.

4. The optical component driving mechanism as claimed in claim 3, wherein the first driving assembly is configured to drive the first movable portion to move relative to the fixed portion, wherein the first driving assembly comprises a magnetic component, and the magnetic component is disposed on the retaining wall.

5. The optical component driving mechanism as claimed in claim 3, wherein the fixed portion further comprises a top cover comprising a filling portion, wherein the top cover is affixed to the base by soldering the top plate to the filling portion.

6. The optical component driving mechanism as claimed in claim 1, further comprising a second circuit member, wherein the first circuit member comprises a first electrical connection portion, the second circuit member comprises a second electrical connection portion, and the first electrical connection portion is electrically connected to the second electrical connection portion.

7. The optical component driving mechanism as claimed in claim 6, wherein the first electrical connection portion is connected to the second electrical connection portion by soldering.

8. The optical component driving mechanism as claimed in claim 6, further comprising a first sensing component disposed on the second circuit member to sense the position of the first movable portion relative to the fixed portion.

9. The optical component driving mechanism as claimed in claim 6, wherein the second electrical connection portion of the second circuit member is disposed between the second reinforcing component and the first electrical connection portion of the first circuit member.

10. The optical component driving mechanism as claimed in claim 9, wherein the fixed portion comprises an accommodating portion, wherein the second reinforcing component is disposed in the accommodating portion.

11. The optical component driving mechanism as claimed in claim 9, wherein the first circuit member comprises an inner surface and an outer surface, wherein the first reinforcing component is disposed on the outer surface, and the second reinforcing component is disposed on the inner surface.

12. The optical component driving mechanism as claimed in claim 9, wherein the first reinforcing component and the second reinforcing component do not overlap in a direction that is perpendicular to the first optical axis.

13. The optical component driving mechanism as claimed in claim 1, wherein the fixed portion comprises an opening, wherein the control integrated circuit is disposed on the first circuit member, and the opening accommodates the control integrated circuit.

14. The optical component driving mechanism as claimed in claim 1, further comprising a first sensing component, wherein the first sensing component receives the first driving signal, and then outputs a first driving power to the first driving assembly.

15. The optical component driving mechanism as claimed in claim 1, further comprising a second driving assembly, wherein the control integrated circuit outputs a second driving signal to drive the second driving assembly.

16. The optical component driving mechanism as claimed in claim 15, further comprising a second sensing component that outputs a second sensing signal to the control integrated circuit, wherein the control integrated circuit outputs the second driving signal according to the second sensing signal.

17. The optical component driving mechanism as claimed in claim 1, wherein the first reinforcing component comprises a magnetically permeable material.

18. The optical component driving mechanism as claimed in claim 1, further comprising a second circuit member comprising a first portion and a second portion, wherein the first portion is located on one side of the first movable portion, and the second portion is located on another side of the first movable portion.

19. The optical component driving mechanism as claimed in claim 18, wherein the base comprises a protruding portion, the protruding portion fixes the positions of the first circuit member, the second portion of the second circuit member, and the second reinforcing component relative to the base.

20. The optical component driving mechanism as claimed in claim 1, wherein the fixed portion comprises a base, the base comprises an accommodating portion, the second reinforcing component is disposed in the accommodating portion of the base.

* * * * *